United States Patent [19]

Chen

[11] Patent Number: 5,077,530

[45] Date of Patent: Dec. 31, 1991

[54] LOW-VOLTAGE MODULATOR FOR CIRCULAR INDUCTION ACCELERATOR

[75] Inventor: Felix K. Chen, Newtown, Conn.

[73] Assignee: Schlumberger Technology Corporation, New York, N.Y.

[21] Appl. No.: 598,482

[22] Filed: Oct. 16, 1990

[51] Int. Cl.⁵ .................... H01S 23/34; H05H 11/00
[52] U.S. Cl. ................................. 328/233; 328/237
[58] Field of Search .................. 328/233, 237; 313/62; 315/205, 240, 244

[56] References Cited

U.S. PATENT DOCUMENTS 3,975,689  8/1976  Geizer et al. .................... 328/237

OTHER PUBLICATIONS

"Thyristor Current-Pulse Generator For Betatron Electromagnet With Independent Low-Voltage Supply", B. A. Baginskii et al., Nuclear Experimental Techniques (Translated from Pribory i Tekhnika Eksperimenta, No. 4, pp. 16-18, Jul.-Aug. 1988; Original Article submitted Dec. 4, 1986, revision submitted Nov. 19, 1987) pp. 832-835.

"An 80-Mev Model of a 300-Mev Betatron", D. W. Kerst et al., The Review of Scientific Instruments, vol. 21, Number 5, May 1950.

"Compact Betatron with Four Controlling-Field Periodicity Elements" Nuclear Techniques, V. L. Chakhlov et al., 0020-4412/86/2904, pp. 787-789, 7/1987.

Primary Examiner—Donald J. Yusko
Assistant Examiner—Diab Hamadi
Attorney, Agent, or Firm—Richard G. Berkley; Leonard W. Pojunas

[57] ABSTRACT

A modulator circuit for a betatron includes an independent low voltage D.C. powder supply, an intermediate low voltage capacitor connected to one side of the betatron winding, and a high voltage capacitor connected to the other side of the betatron winding. Unidirectional current devices normally permit current flow from the voltage capacitor, through the betatron winding to the high voltage capacitor. Energy is thereby transferred from the power supply and low voltage capacitor through the betatron winding to the high voltage capacitor. Switches are provided selectively to reverse the direction of current flow and thereby discharge the energy stored in both capacitors into the betatron winding to excit the betatron magentic circuit. Upon discharge of the high voltage capacitor, the unidirectional current devices once again restore normal current flow, so that the energy stored in the betatron electromagnet is returned to the high voltage capacitor. Repetition of this charging/discharging/recovery cycle pumps up the charge on the high voltage capacitor and multiplies the voltage.

6 Claims, 1 Drawing Sheet

LOW-VOLTAGE MODULATOR FOR CIRCULAR INDUCTION ACCELERATOR

FIELD OF THE INVENTION

The present invention relates to magnetic induction accelerators of the betatron type and, more specifically, to an improved modulator circuit for driving a betatron by use of an independent low voltage power supply. Still more specifically, the invention relates to such a low voltage power supply circuit adapted to drive a betatron in a borehole logging tool environment.

CROSS-REFERENCE TO RELATED APPLICATIONS

The invention of the present application is related to the invention disclosed in the commonly owned U.S. application Ser. No. 07/598,298 filed concurrently herewith for "Circular Induction Accelerator for Borehole Logging".

BACKGROUND OF THE INVENTION

FIG. 1 depicts a conventional betatron driving circuit. A high voltage D.C. power supply 10 is coupled across a capacitor 12 to modulator (pulse-generating) circuits 14, which pulse the primary betatron coil circuits 16 at the desired repetition rate with time-varying voltage pulses to accelerate electrons trapped within betatron field. During each acceleration cycle, the energy stored in the capacitor 12 is transferred to the betatron magnetic circuit through a switching network (contained in the modulator 14), and at the end of each cycle the remaining energy in the magnetic circuit is returned to the capacitor 12 through a recovery network (also in the modulator 14). Due to losses in the magnetic circuit, the capacitor and the switching-/recovery networks, a fraction of the original energy is not recovered and must be replenished by the power supply. That means that the power supply 10 must have an output voltage greater than, or at least equal to, the maximum voltage intended for the capacitor 12 or, in other words, the maximum excitation voltage to be applied to the betatron circuits.

In a typical borehole logging tool, such maximum voltage would be on the order of 1-2 KV or possibly even higher. Although not a problem in a laboratory environment, the requirement for a high voltage capacitor/charging power supply system is both troublesome and costly in the hostile, confined environment of a borehole logging tool.

A pulse-generating circuit for a betatron having an independent low voltage power supply has been described by Baginskii et al. for use in flaw detection under nonstationary conditions, "Thyristor Current-Pulse Generator for Betatron Electromagnet with Independent Low-Voltage Supply", Nuclear Experimental Techniques, Vol. 31, No. 4, Part I, pp. 832-835, 1989, translated from Pribory i Tekhnika Eksperimenta, No. 4, pp. 16-18, July-August, 1988. The Baginskii et al. circuit employs a conventional rectifier bridge, the D.C. diagonal of which contains the betatron winding and the A.C. diagonal of which contains a high voltage storage capacitor for supplying the high voltage excitation energy to the betatron. Energy to replenish the losses in the circuit is transferred from the low voltage power supply to the high voltage storage capacitor via an intermediate inductive storage circuit. This circuit is reported to have produced a voltage of 1.5 KV on the betatron winding using a 27 V D.C. power supply. Although an inductive storage device can act as an effective buffer between the low voltage power supply and the high voltage storage capacitor, such circuits are subject to excess energy losses. This is because the energy is stored in the magnetic field supported by the current flowing in the inductor. Thus energy is being lost while it is stored in the inductor due to the non-zero current.

SUMMARY

In accordance with the invention, a modulator circuit for driving a betatron includes an independent, low voltage D.C. power supply, an intermediate low voltage charging capacitor, and a high voltage excitation capacitor. The betatron winding is coupled in inductive charging relation between the low and high voltage capacitors. Unidirectional current devices permit discharging current flow from the low voltage capacitor through the betatron winding to the high voltage capacitor, but block reverse current flow. Both capacitors initially see the same power supply voltage and are charged to that voltage. The low voltage capacitor is selected to have a very much greater capacitance than the high voltage capacitor, so that the low voltage capacitor will acquire a much greater total charge than that acquired by the high voltage capacitor.

When both capacitors are charged to the power supply voltage, switching circuits are operated to reverse the direction of current flow in the circuit, thereby discharging the energy stored in both capacitors into the betatron winding and exciting the magnetic circuit. Because $q_1 >> q_2$, the high voltage capacitor discharges much more rapidly than the low voltage capacitor. As soon as the high voltage capacitor is discharged, the switching circuits are again operated to restore the direction of current flow through the high voltage capacitor. This results in a portion of the energy stored in the low voltage capacitor being transferred to the high voltage capacitor via the betatron electromagnet. The voltage on the low voltage capacitor is then restored to its initial value by the power supply.

The foregoing cycle is repeated, and pumps up the charge on the high voltage capacitor until the circuit losses are exactly balanced by the energy drawn from the low voltage capacitor. The circuit is then in equilibrium at the operating excitation voltage of the betatron. In this way, the modulator circuit of the invention affords both large voltage gain and highly efficient energy recovery, while requiring only a low voltage D.C. power supply.

BRIEF DESCRIPTION OF THE DRAWINGS

For a better understanding of the invention, reference may be made to the following description of a representative embodiment thereof, taken together with the accompanying drawings, in which.

DETAILED DESCRIPTION

Figure 1:
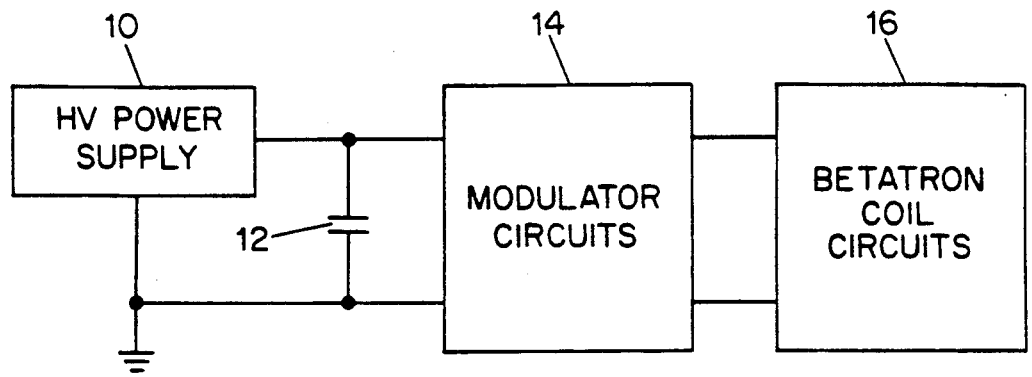
FIG. 1 is a block diagram of a conventional driving circuit for a betatron.
Figure 2:
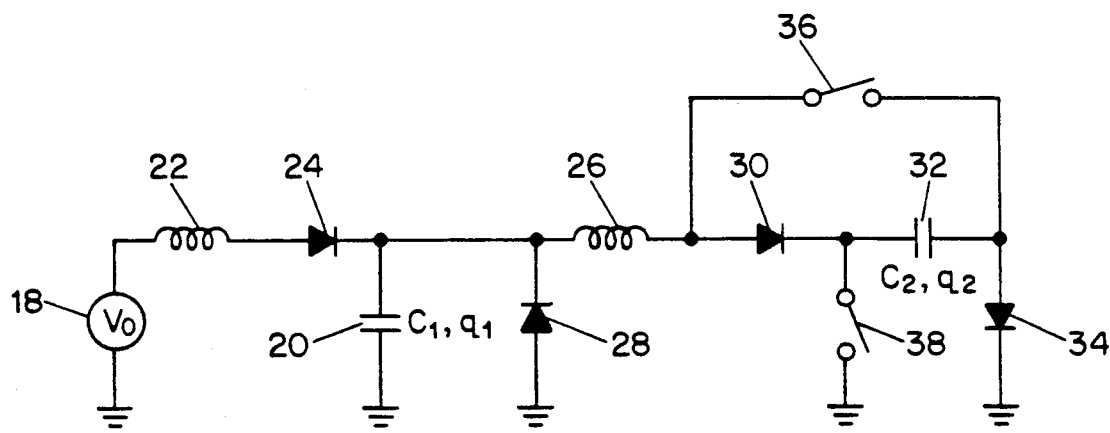
FIG. 2 is a schematic diagram of one embodiment of a low voltage-driven modulator circuit for a betatron in accordance with the invention.

In the preferred embodiment of the invention shown in FIG. 2, the positive terminal of an independent, low voltage D.C. power supply 18, e.g., on the order of 10–100V, is connected to an intermediate, low voltage storage capacitor 20, via an isolation choke 22 and diode 24, and to the positive side of the betatron winding 26. For simplicity, the betatron windings are depicted in FIG. 2 by the single coil 26. The windings are of course typically more complex, and it will be understood that the simple coil 26 of FIG. 2 is intended to be merely illustrative of the actual windings. A diode 28 isolates the positive side of the winding 26 from electrical ground. The negative side of the betatron winding is connected through a blocking diode 30 to a high voltage storage capacitor 32. The diode 34 isolates the capacitor 32 from ground. As will be appreciated, the capacitor 20, choke 22 and diode 24 comprise an intermediate low voltage charging circuit for transferring energy through the betatron winding 26 to the high voltage excitation circuit comprised by the diode 30, capacitor 32 and diode 34. As described more fully hereinafter, switches 36 and 38 are provided selectively, when open or nonconducting, to permit current flow from the low voltage capacitor 20 through the betatron winding 26 to the high voltage capacitor 32 and, when closed or conducting, to reverse current flow so as to discharge the combined charge of both capacitors through the winding and thereby excite the betatron magnetic circuit.

The capacitor 20 is continuously charged by the source 18 through the choke 22. This effectively isolates the D.C. power supply 18 from the A.C. and other time-varying transients in the circuit. The diode 24 also serves to isolate the power supply 18 from circuit transients. Alternatively, a charging switch could be used for that purpose.

At the beginning ($t=0$) of each charging cycle (see FIG. 3), the switches 36 and 38, which may be high energy FET devices, are open and remain open until a time ($t=t_1$) at which capacitor 20 ($V_1$) is fully charged to the volta $V_0$ of the constant D.C. power supply 18, e.g. to 10 V. The main capacitor 32 ($V_2$) is similarly charged to 10 V through the windings 26 and diodes 30 and 34. The capacitors 20 and 32 are selected such that the capacitance ($C_1$) of capacitor 20 is very much greater, e.g. by a factor of 100 or more, than the capacitance ($C_2$) of the capacitor 32 and such that the initial charge ($q_1$) on capacitor 20 is very much greater than the initial charge ($q_2$) on capacitor 32. At $t=t_1$, the switches 36, 38 are closed, whereupon the diode 30 becomes reverse-biased and the charge on the capacitors 20, 32 is discharged into the betatron winding 26 via the current path 20, 26, 36, 32 and 38. The voltage across the winding 26 is thus equal to the sum of the voltages on capacitors 20 and 32, and all the energy stored in capacitor 32 and a portion of the energy in capacitor 20 is transferred to the winding 26.

Because $q_2$ is much less than $q_1$, capacitor 32 is discharged before capacitor 20. Depending on the application, the switches 36, 38 can be reopened at a time ($t=t_3$) before, simultaneous with, or after capacitor 32 ($V_2$) has been discharged. Upon opening of the switches, the diodes 30 and 34 become forward biased, thereby causing the current flowing through capacitor 32 to change polarity. Thus, the energy in the betatron magnet is returned to capacitor 32 through the current path 20, 26, 30, 32, 34. The current (I) in the circuit eventually drops to zero, at which time ($t=t_5$) the capacitor 32 is fully recharged ($V_2$ in FIG. 3) and the diodes 30 and 34 are again reverse biased. This completes one charging and recovery cycle.

In this way, the voltage $V_2$ across capacitor 32 is built up as the charging/recovery cycle is repeated until the loss in the circuit equals the amount of energy discharged from the capacitor 20 during a cycle. If the amount of energy drawn from capacitor 20 during a cycle exceeds circuit losses, the difference goes to capacitor 32 and increases $q_2$. When the point is reached where circuit losses equal the energy discharged from capacitor 20, the system is in equilibrium and, thereafter, the voltage on capacitor 32 at the beginning and end of a cycle remains substantially constant.

The energy efficiency of the modulator circuit, $\sigma$, is the ratio of energy recovered to the energy discharged into the modulator circuit per pulse. It depends upon the efficiencies of individual components in the circuit and is a function of the maximum discharge current and the modulation frequency f:

$$f \approx \frac{1}{2\pi \sqrt{LC_2}} \qquad (1)$$

where L is the betatron inductance and $C_2$ is the capacitance of capacitor 32. There are three types of losses encountered in the circuit: (i) hysteresis loss in the magnet which depends mainly on the maximum magnetic field reached in the magnet, (ii) eddy current loss in the magnet and coils which increases rapidly with the magnetic field and the modulation frequency, and (iii) ohmic loss which increases with the discharge current and, for a given maximum current, reduces with the modulation frequency f. The best overall efficiency is usually accomplished by making L as large as possible, which reduces both the maximum discharge current and the modulation frequency. The increase in ohmic loss due to a longer current circulation time in a circuit of a lower f is more than compensated by the reduction in the maximum current it takes to deliver the same amount of energy to the betatron magnet.

To determine the voltage gain, it is assumed that the switches 36, 38 open at the time capacitor 32 is discharged, i.e. at $t_3$. To facilitate the following discussion, it is further assumed that capacitor 20, having capacitance $C_1$, is disconnected from the power supply during each discharge/recovery cycle by opening a charging switch. If $V_1$ and $V_{1f}$ are the initial and final voltages of capacitor 20, respectively, $V_2$ is the voltage of capacitor 32, both before and after the discharge/recovery cycle, and $C_1$ and $C_2$ are the capacitances of capacitors 20 and 32, respectively, the energy loss in each cycle is:

$$\Delta\epsilon = \frac{1}{2} C_1(V_1^2 - V_{1f}^2) \qquad (2)$$

and, $$\eta = \frac{\frac{1}{2} C_2 V_2^2}{\frac{1}{2} C_2 V_2^2 + \Delta\epsilon} \qquad (3)$$

The total charge flowing out of capacitor 20 in each cycle is $2Q_2 = 2C_2C_2$, and the remaining charge in capacitor 20 is $C_1C_{1f} = C_1V_1 - 2Q_2 = C_1V_1 - 2C_2V_2$, or:

$$\frac{V_{1f}}{V_1} = 1 - 2\frac{C_2V_2}{C_1V_1} \quad (4)$$

The following voltage gain is thus obtained by combining equations (2)–(4):

$$\frac{V_2}{V_1} = \frac{4\eta}{(1-\eta) + 4\eta\frac{C_2}{C_1}} \quad (5)$$

The voltage gain approaches the asymptotic value:

$$\frac{V_2}{V_1} = \frac{4\eta}{1-\eta} \quad (6)$$

if $$\frac{C_1}{C_2} >> \frac{4\eta}{1-\eta} \quad (7)$$

Figure 3:
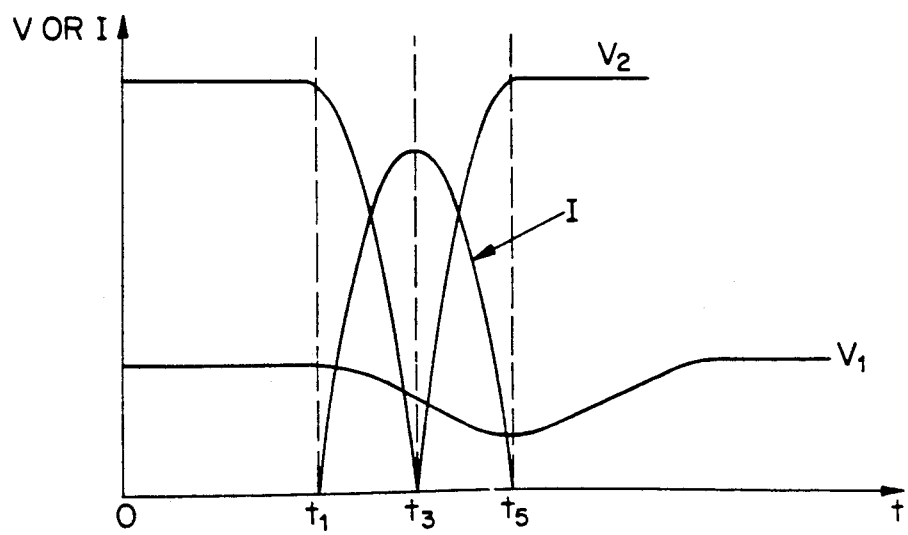
FIG. 3 is a graph showing the variation with time of the voltage ($V_1$) on the low voltage capacitor, the voltage ($V_2$) on the high voltage capacitor, and the current (I) in the circuit.

A test circuit constructed in accordance with FIG. 2 and having $L = 20\mu H$, $C_1 = 270\mu f$, $C_2 = 2.5\mu f$, $V_1 = 26V$, and $V_2 = 650V$, achieved an efficiency of 89% and a voltage gain of 25. The waveforms of voltages $V_1$ and $V_2$ across capacitors 20 and 32, respectively, and the current waveform I in the betatron 26 are shown in FIG. 3.

Although the invention has been described and illustrated herein by reference to a specific embodiment thereof, it will be understood that such embodiment is susceptible of variation and modification without departing from the inventive concepts disclosed. All such variations and modifications, therefore, are intended to be included within the spirit and scope of the appended claims.

I claim:

1. A modulator circuit for a betatron having at least one magnetizing winding, comprising:
   a low voltage D.C. power supply;
   a low voltage capacitive means coupled across said power supply;
   a high voltage capacitive means coupled across said power supply, the capacitance of said low voltage capacitive means being very much greater than the capacitance of said high voltage capacitive means;
   the winding of said betatron being coupled in inductive charging relation between said low voltage capacitive means and said high voltage capacitive means;
   unidirectional current means operatively coupled between said betatron winding and said high voltage capacitive means for normally permitting current flow from said low voltage capacitive means through said betatron winding to said high voltage capacitive means but preventing reverse current flow; and
   switching means for selectively reversing the direction of current flow between said low voltage capacitive means and said high voltage capacitive means to discharge the energy stored in said high voltage capacitive means and said low voltage capacitive means into said betatron winding.

2. The modulator circuit of claim 1 further comprising isolation means operatively coupled between said low voltage capacitive means and said power supply to isolate the power supply from circuit transients.

3. The modulator circuit of claim 2 wherein said isolation means comprises a choke and a unidirectional current device.

4. The modulator circuit of claim 1 wherein the capacitance of said low voltage capacitive means is greater than the capacitance of said high voltage capacitive means by a factor of substantially 100 or more.

5. The modulator circuit of claim 1 wherein said switching means comprises:
   a first switch operatively coupled between the negative side of said high voltage capacitive means and the negative side of said winding; and
   a second switch operatively coupled between the positive side of said high voltage capacitive means and electrical ground.

6. The modulator circuit of claim 5 wherein said first and second switches are switched simultaneously between nonconducting and conducting states to charge and discharge, respectively, said high voltage capacitive means.

* * * * *

UNITED STATES PATENT AND TRADEMARK OFFICE
CERTIFICATE OF CORRECTION

PATENT NO. : 5,077,530
DATED : Dec. 31, 1991
INVENTOR(S) : Felix K. Chen

It is certified that error appears in the above-identified patent and that said Letters Patent is hereby corrected as shown below:

Col. 1, line 15, "APPLICATIONS" should read --Application--.

Col. 3, line 43, "volta" should read --voltage--.

Col. 4, line 19, "$\delta$" should read --$\wedge$--.

Col. 5, line 2, "$2C_2C_2$" should read --$2C_2V_2$--; line 3, "$C_1C_{1f}$" should read --$C_1V_{1f}$--; line 11, that portion of the equation reading "$\frac{V2}{V_1}$" should read --$\frac{V_2}{V_1}$--.

Signed and Sealed this

Twenty-fourth Day of August, 1993

Attest:

BRUCE LEHMAN

Attesting Officer     Commissioner of Patents and Trademarks